(12) United States Patent
Gardner et al.

(10) Patent No.: US 8,513,750 B2
(45) Date of Patent: Aug. 20, 2013

(54) FORMING INDUCTOR AND TRANSFORMER STRUCTURES WITH MAGNETIC MATERIALS USING DAMASCENE PROCESSING FOR INTEGRATED CIRCUITS

(75) Inventors: Donald S. Gardner, Mountain View, CA (US); Gerhard Schrom, Hillsboro, OR (US); Peter Hazucha, Beaverton, OR (US); Fabrice Paillet, Hillsboro, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 305 days.

(21) Appl. No.: 12/882,529

(22) Filed: Sep. 15, 2010

(65) Prior Publication Data

US 2011/0001202 A1    Jan. 6, 2011

Related U.S. Application Data

(62) Division of application No. 11/968,122, filed on Dec. 31, 2007, now Pat. No. 7,867,787.

(51) Int. Cl.
| | | |
|---|---|---|
| *H01L 21/336* | (2006.01) | |
| *H01L 21/76* | (2006.01) | |
| *H01L 21/425* | (2006.01) | |
| *H01L 21/469* | (2006.01) | |

(52) U.S. Cl.
USPC ........... 257/421; 257/295; 257/422; 257/414; 257/531; 257/758; 257/E21.022; 257/E21.175; 257/E21.585

(58) Field of Classification Search
USPC ................ 257/E21.022, E21.175, E21.585
See application file for complete search history.

(56) References Cited

U.S. PATENT DOCUMENTS

| | | | |
|---|---|---|---|
| 6,331,479 B1 | 12/2001 | Li et al. | |
| 6,534,374 B2 | 3/2003 | Johnson et al. | |
| 6,639,298 B2 * | 10/2003 | Chaudhry et al. | 257/531 |
| 6,940,147 B2 * | 9/2005 | Crawford et al. | 257/531 |
| 6,958,526 B2 * | 10/2005 | Gates et al. | 257/642 |
| 7,129,561 B2 | 10/2006 | Coolbaugh et al. | |
| 7,247,544 B1 | 7/2007 | Drizlikh et al. | |
| 7,538,653 B2 * | 5/2009 | Schrom et al. | 336/200 |
| 2004/0191981 A1 * | 9/2004 | Yates et al. | 438/238 |
| 2006/0228283 A1 * | 10/2006 | Malyala et al. | 423/239.1 |
| 2008/0238596 A1 * | 10/2008 | Schrom et al. | 335/297 |
| 2009/0117325 A1 * | 5/2009 | Gardner et al. | 428/138 |

FOREIGN PATENT DOCUMENTS

WO     2008/085265 A1    7/2008

OTHER PUBLICATIONS

International Preliminary Report on Patentability received for PCT Patent Application No. PCT/US2008/085265, mailed on Jul. 15, 2010, 9 pages.
International Search Report received for PCT Application No. PCT/US2008/085265, mailed on Jun. 1, 2009, 2 pages.
Written Opinion received received for PCT Patent Application No. PCT/US2008/085265, mailed on Jun. 1, 2009, 10 pages.

* cited by examiner

*Primary Examiner* — Mohsen Ahmadi
(74) *Attorney, Agent, or Firm* — Forefront IP Lawgroup, PLLC

(57) ABSTRACT

Methods and associated structures of forming microelectronic devices are described. Those methods may include forming a first layer of magnetic material and at least one via structure disposed in a first dielectric layer, forming a second dielectric layer disposed on the first magnetic layer, forming at least one conductive structure disposed in the second dielectric layer, forming a third layer of dielectric material disposed on the conductive structure, forming a second layer of magnetic material disposed in the third layer of dielectric material and in the second layer of dielectric material, wherein the first and second layers of the magnetic material are coupled to one another.

8 Claims, 6 Drawing Sheets

US 8,513,750 B2

FORMING INDUCTOR AND TRANSFORMER STRUCTURES WITH MAGNETIC MATERIALS USING DAMASCENE PROCESSING FOR INTEGRATED CIRCUITS

CROSS REFERENCE TO RELATED APPLICATIONS

The present application is a divisional of now pending U.S. patent application Ser. No. 11/968,122, entitled "FORMING INDUCTOR AND TRANSFORMER STRUCTURES WITH MAGNETIC MATERIALS USING DAMASCENE PROCESSING FOR INTEGRATED CIRCUITS" filed on Dec. 31, 2007.

BACKGROUND OF THE INVENTION

Magnetic materials may be used to fabricate microelectronic devices, such as inductor and transformer devices. Inductors and transformer structures may be used in microelectronic circuits such as on-chip and on-package voltage converters, RF high-frequency circuits, radar applications and EMI noise reduction circuits. To obtain the maximum inductance, magnetic flux loss should be minimized to avoid significant loss in inductance.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
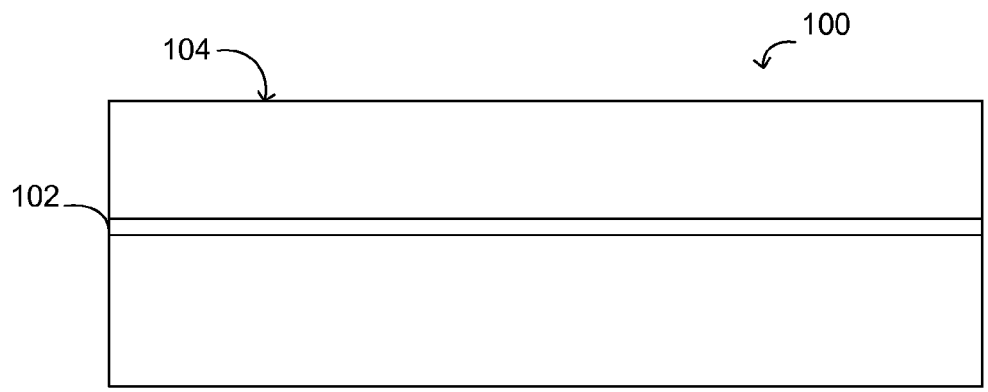
FIGS. 1a-1k represent structures according to embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may include forming a first layer of magnetic material in an opening in a first dielectric layer, forming a barrier layer in a first via opening disposed in the dielectric layer and then forming a conductive material on the barrier layer. A second dielectric layer may then be formed on the first magnetic layer, and at least one second via and at least one conductive structure opening may be formed in the second dielectric layer. A barrier layer and a conductive material may be formed in the at least one second via and in the conductive structure opening, and then a third layer of dielectric material may be formed on the at least one second via and on the conductive material.

An opening may be formed in the third dielectric layer, and then a second layer of magnetic material may be formed in the opening, wherein the first and second layers of the magnetic material may be coupled to one another. Methods of the present invention enable the fabrication of microelectronic devices, such as, for example, inductor and transformer structures by using a damascene process, for example. Such microelectronic devices may comprise via structures that are optimized to obtain good inductance values, thus allowing for improved device performance.

FIGS. 1a-1j illustrate an embodiment of a method of forming a microelectronic structure, such as an inductor structure, for example. FIG. 1a illustrates a cross-section of a portion of a substrate 100. The substrate 100 may be comprised of dielectric materials such as, but not limited to, silicon dioxide and silicon nitride. In one embodiment, the substrate 100 may comprise a nitride layer 102 and a first dielectric layer 104, wherein the first dielectric layer 104 may comprise an interlayer dielectric (ILD) in some embodiments. In one embodiment, the nitride layer 102 may comprise a thickness of about 1 micron or less, and the first dielectric layer 104 may comprise a thickness of less than about 3.5 microns.

The substrate 100 may further comprise microelectronic packaging materials and structures as are known in the art. In one embodiment, the substrate 100 may include transistors and other devices that, together, form a microprocessor (not shown). In an embodiment, the substrate 100 may include devices that together form multiple microprocessor cores on a single die. In one embodiment, the substrate may include CMOS (complementary metal oxide semiconductor) devices comprising multi-level metallization.

Figure 1B:
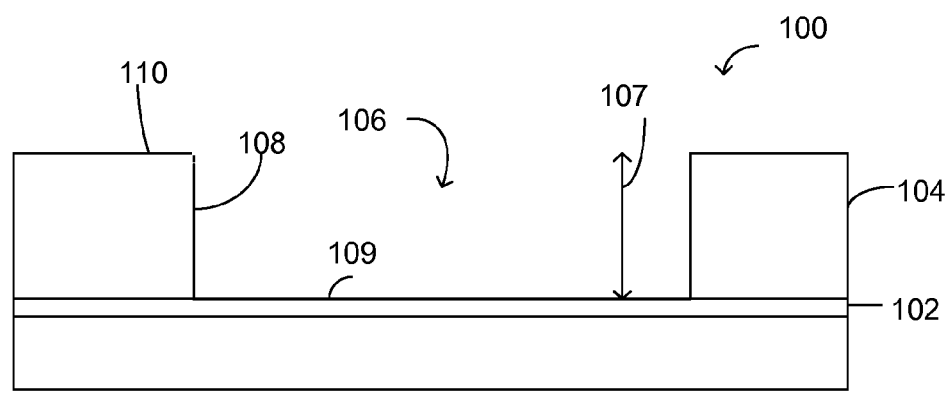
Figure 1C:
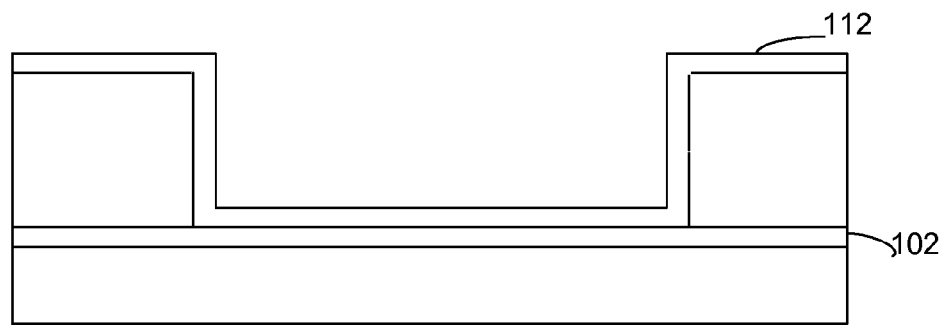

An opening 106 may be formed in the first dielectric layer 104 (FIG. 1b). In one embodiment, the opening 106 may comprise a trench/via of a damascene structure. The opening 106 may comprise a depth 107 of about 2 microns or less in an embodiment. After the opening 106 is formed in the first dielectric layer 104, the first dielectric layer 104 may comprise a top portion 110 and a sidewall portion 108. The opening 106 may expose a top portion 109 of the nitride layer 102. In one embodiment, a seed layer 112 may be formed on the sidewall portion 108 and on the top portion 110 of the dielectric layer 104, as well as on the top portion of the nitride layer 109 (FIG. 1c). In one embodiment, the seed layer 112 may serve to facilitate the plating of a material (by various plating techniques, according to the particular application), such as the plating of a magnetic material for example, on the seed layer 112 during subsequent processing steps.

In one embodiment, the seed layer 112 may be formed by depositing a titanium containing layer of about 40 angstroms or less on the top portion 109 of the nitride layer 102, followed by the formation of a copper seed layer and/or a cobalt seed layer on the titanium containing layer. In one embodiment, the thickness of the copper and/or cobalt seed layer may comprise about 0.3 microns or less. In another embodiment, the seed layer 112 may comprise an adhesion layer, such as a titanium containing layer, for example. In one embodiment, the deposition of the seed layer 112 can be performed by utilizing sputtering, reactive sputtering, electroplating, chemical vapor deposition (CVD), atomic layer deposition (ALD), or evaporation techniques.

Figure 1D:
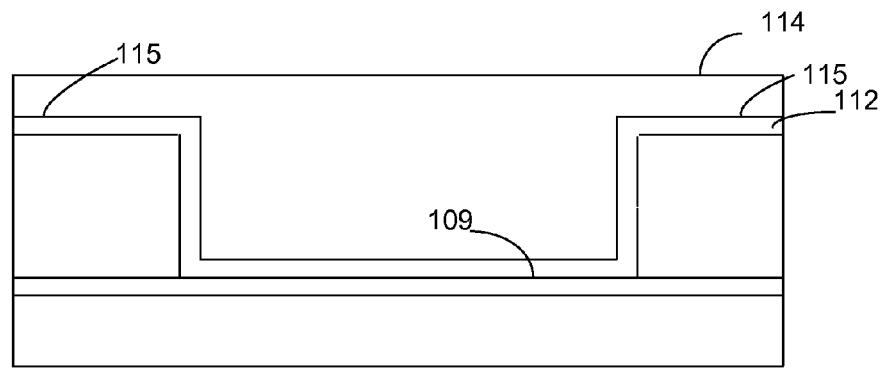

In one embodiment, a first layer of magnetic material 114 may be formed on the seed layer 112 (FIG. 1d). The first magnetic material 114 may be formed utilizing a sputtering, electroplating, electroless plating, CVD, or other thin film technique according to the particular application. In another embodiment, the first layer of magnetic material 114 may be formed by a technique that may not require a seed layer 112, such as by an electroless plating technique, for example, such that the first layer of magnetic material 114 may be formed directly on the top portion 109 of the nitride layer 102 and on the dielectric layer 104 in some embodiments.

In one embodiment, the first layer of magnetic material 114 may comprise CoZrTa, CoNbTa, NiFe, CoP, CoPB, CoPRe, CoZr, CoZr Mo, FeCoAlN, CoZrTaN, FeCoP, CoPW, CoPBW, FeTaN, FeCoBSi, and combinations thereof. In another embodiment, the first layer of magnetic material 114 may comprise FeCoZrO, FeCoHfO, FeCoTiO, CoTi, FeCoB, soft ferrites such as CoZrOx and NiCuZnFeOx, and combinations thereof. These materials may have a variation in their composition in some cases. For example, CoZrTa can comprise a Zr percentage from about 3 to about 12 atomic percent, and can comprise a Ta percentage of about 3 to about 10 atomic percent. In one embodiment, the first layer of magnetic material 114 may comprise high-frequency amorphous magnetic materials.

Figure 1E:
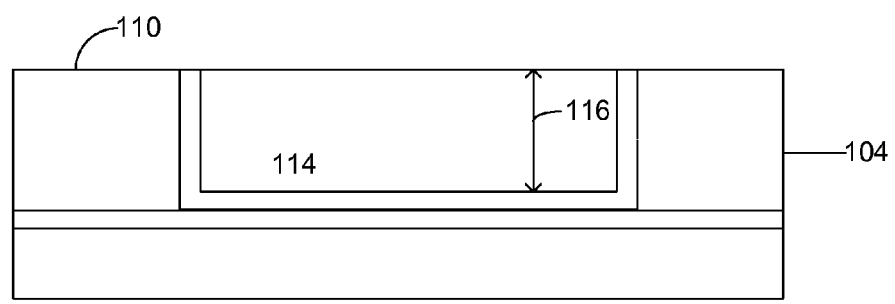

The first layer of magnetic material 114 may be removed from the top portion 110 of the first dielectric layer 104, and an underlying top portion 115 of the seed layer 112 may be removed as well from the first dielectric layer 104 by utilizing a chemical mechanical polishing (CMP) technique, for example (FIG. 1e). In some embodiments, the first layer of magnetic material 114 may comprise a thickness 116 of about 0.1 microns to about 20 microns.

Figure 1F:
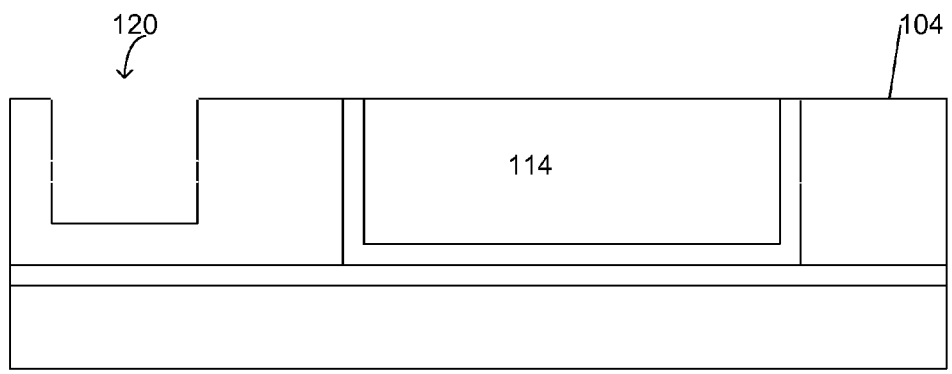
Figure 1G:
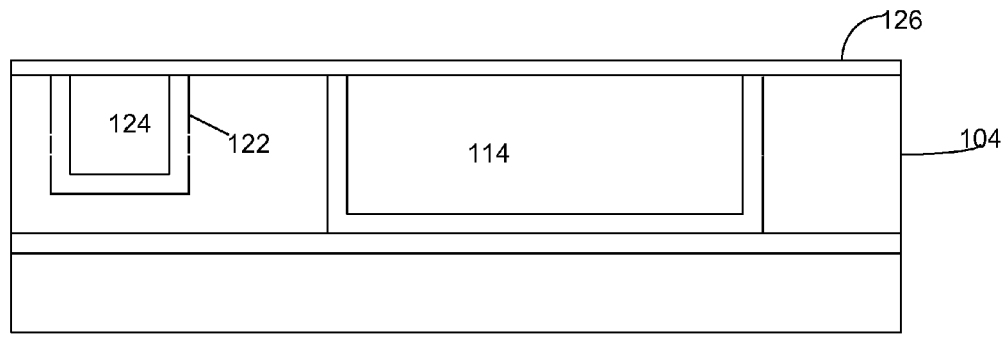

A first via opening 120 may be formed in the first dielectric layer 104 (FIG. 1f). A barrier layer 122 may then be formed in the first via opening 120 (FIG. 1g), and then a conductive material 124 may be formed on the barrier layer. In one embodiment, the barrier layer 122 may comprise at least one of tantalum and tantalum nitride. The conductive material 124 may comprise a copper containing material in some embodiments. The conductive material 124 and the barrier layer 122 may be removed from the top surface 110 of the first dielectric layer 104 by utilizing a CMP process for example (not shown).

Subsequently, a first thin dielectric layer 126 may be formed on the conductive material 124, the barrier layer 122, the top surface of the first dielectric layer 104 and on the first layer of magnetic material 114, wherein the first thin dielectric layer 126 may comprises a thickness of about 0.1 microns to about 0.5 microns in some embodiments. The first thin dielectric layer 126 may comprise at least one of silicon oxide or silicon nitride, by illustration and not limitation.

Figure 1H:
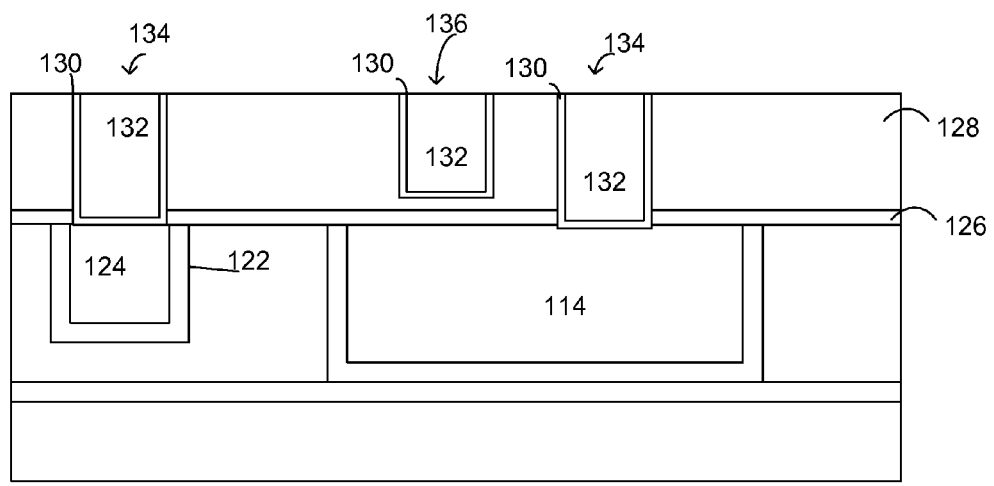

A second dielectric layer 128 may be formed on the first thin dielectric layer 126 and on the first magnetic material layer 114 (FIG. 1h). The second dielectric layer 128 may comprise an ILD in some embodiments, and may comprise a thickness of between about 2 microns and 3 microns. At least one second via opening and at least one conductive structure opening may be formed in the second dielectric layer (not shown). The at least one second via opening and the at least one conductive structure opening may be lined with a barrier layer 130 and further filled with a conductive material 132, which may comprise similar materials as the barrier layer 122 and conductive material 124 of FIG. 1g respectively, to form at least one via structure 134 and at least one conductive structure 136 in the second dielectric layer 128.

Figure 1I:
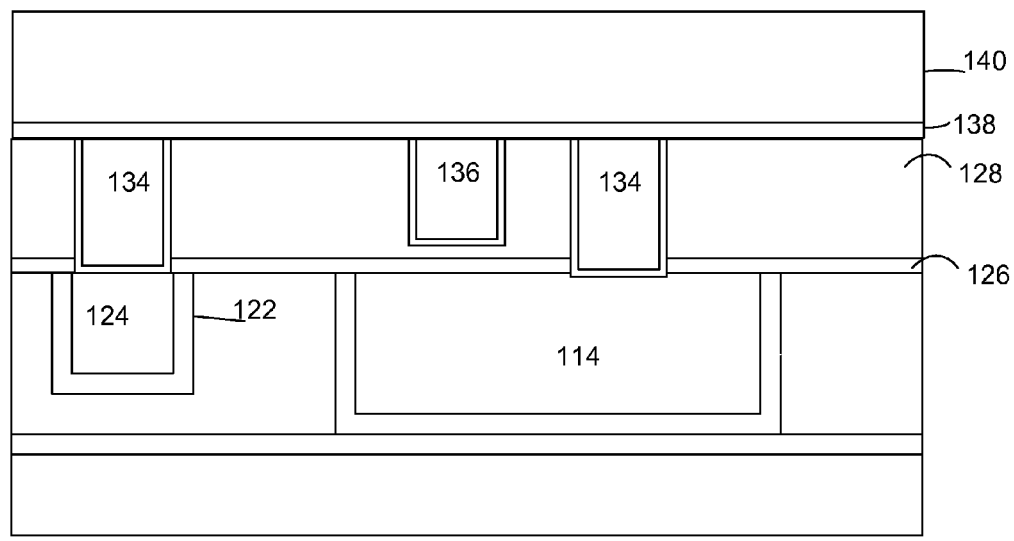

In one embodiment, the at least one conductive structure 136 may comprise a copper interconnect structure, such as a copper wire structure for example, that may comprise inductor wire, in some cases, and may comprise a thickness of about 1 to about 20 microns. The particular thickness of the at least one conductive structure 136 will vary according to the particular application. In some embodiments, there may be a plurality of adjacent conductive structures 136 formed within the second dielectric layer 128 (not shown). A second thin dielectric layer 138 may be formed on the at least one conductive structure 136, the at least one via structure 134, and on the second dielectric 128, wherein the second thin dielectric layer 138 may comprises a thickness of about 0.1 microns to about 0.5 microns, and may comprise at least one of silicon oxide or silicon nitride, by illustration and not limitation (FIG. 1i).

Figure 1J:
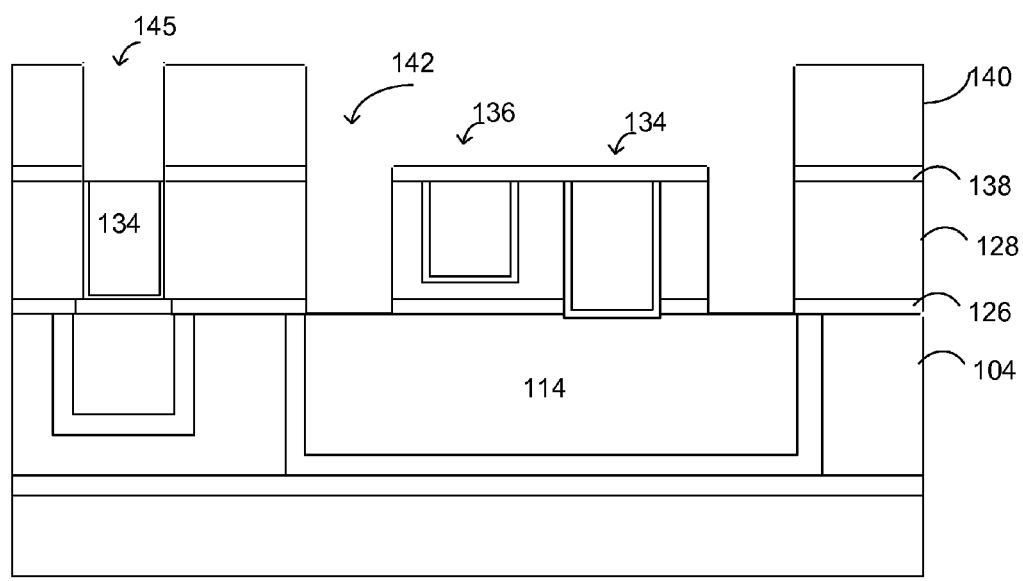

A third dielectric layer 140 may be formed on the second thin dielectric layer 138 and on the first magnetic material layer 114. The third dielectric layer 138 may comprise an ILD in some embodiments, and may comprise a thickness of between about 2 microns and 3 microns. In one embodiment, an opening 142 may be formed in the third dielectric layer 140, in the second thin dielectric layer 138 and in the second dielectric layer 128 that may expose a portion of the first layer of magnetic material 114 (FIG. 1j).

Figure 1K:
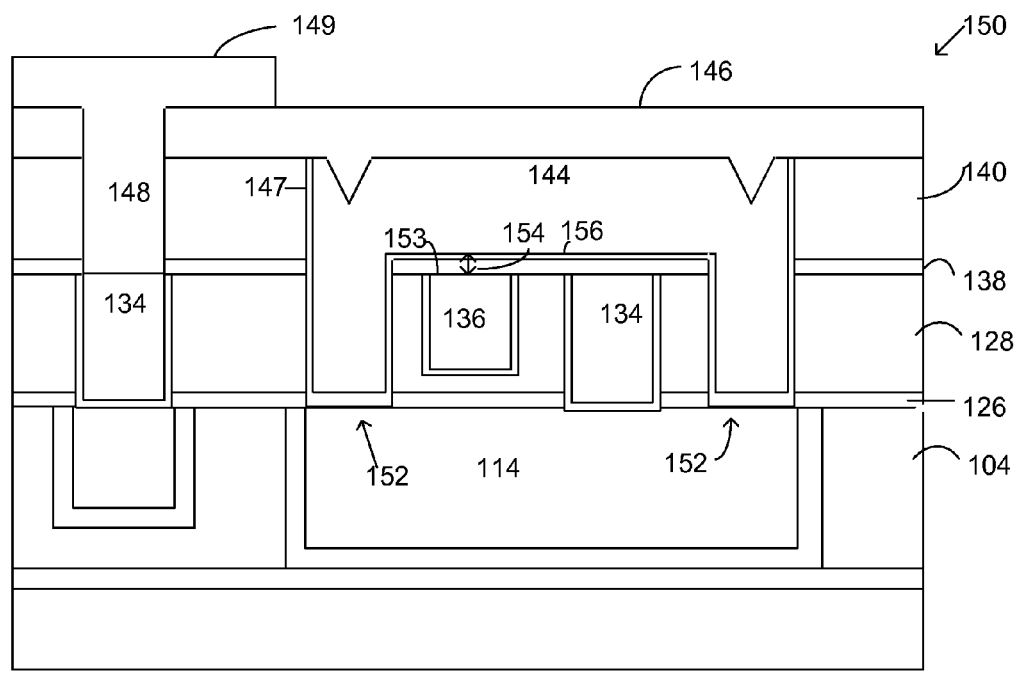

The opening 142 may be formed for the subsequent formation of a second layer of magnetic material 144 that may couple with the first layer of magnetic material 114 (FIG. 1k). In one embodiment, the second layer of magnetic material 144 may comprise similar materials as the first layer of magnetic material 114, or may differ in material composition from the first layer of magnetic material 114, depending upon the application.

In one embodiment, a seed layer 147 may be formed in the opening 142 prior to the formation of the second layer of magnetic material 144, such that the seed layer 147 may be disposed beneath the second layer of the magnetic material 144. A copper bump opening 145 may also be formed in the third dielectric layer 140 and the second thin dielectric layer 138 that may expose a portion of the at least one via structure 134, and that may be subsequently filled with a conductive material, such as but not limited to copper.

A passivation layer 146 may then be formed on the second layer of magnetic material 144 (FIG. 1k). The passivation layer 146 may comprise a polyimide material in one embodiment. An opening may be formed in the passivation layer 146 (not shown) and a conductive material 148 may be formed within the passivation opening to form a conductive bump structure 149 that may couple to the at least one via structure 134 in an embodiment. In one embodiment, a portion of an inductor structure 150 may be formed by utilizing the various embodiments of the present invention.

Thus, a damascene process may be used, according to the various embodiments of the present invention, to fabricate inductor devices, wherein an opening in an ILD layer may be formed for the subsequent formation of magnetic material. Advantages of such a damascene process include the ability to completely fill magnetic vias, wherein layers of the magnetic material may be sandwiched between ILD layers. A thin dielectric thickness (0.1~0.5 micron) may be formed between the inductor wire of the inductor structure and the magnetic material.

In one embodiment, a distance 154 between a top surface 153 of the conductive structure 134 and a bottom surface 156 of the second layer of magnetic material 144 may comprise below about 0.5 micron. Additionally, there may be no magnetic material in the gaps between adjacent conductive structures 134 (that may comprise inductor wires).

The inductive structure 150 may comprise various inductor and transformer structures/devices, for example, and may be used in microelectronic circuits such as voltage converters, on-chip and/or on package RF high-frequency circuits, radar and EMI noise reduction circuits. In one embodiment, the inductive structure 150 may comprise a portion of a submicron CMOS device, and may comprise high-frequency amorphous magnetic materials and multilevel metallization.

At high operating frequencies, the apparent inductance of prior art devices may gradually decrease with frequency because there are losses from eddy currents that flow in the magnetic material. Thus, carefully designed magnetic vias serve to maximize the inductance of such high frequency inductive structures. To obtain a maximum theoretical increase in inductive magnetic flux, the two layers of magnetic material 114, 144 need to make contact so that the magnetic flux loss is minimized to zero. The region wherein the first layer of magnetic material 114 and the second magnetic layer 144 make contact with each other (to complete the circuit for the magnetic flux) may comprise a magnetic via 152. The shape of the magnetic via 152 may be optimized according to the particular application.

Figure 2A:
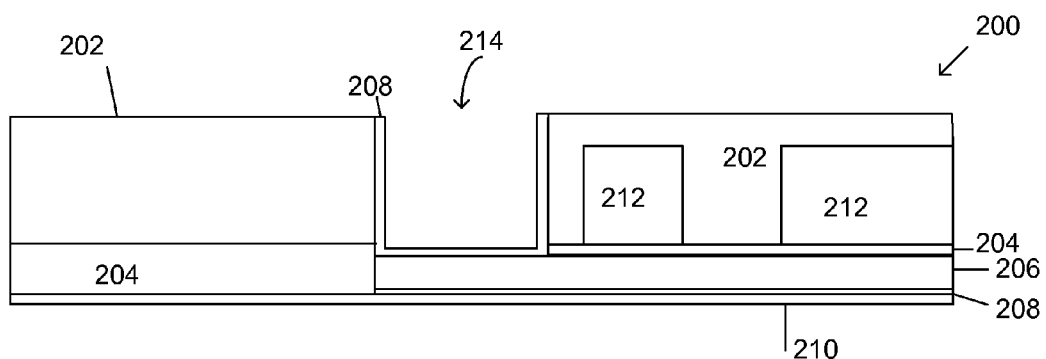
FIGS. 2a-2c represent structures according to embodiments of the present invention.

In another embodiment, a portion of an inductor structure 200 may comprise a first dielectric layer 202 and a second dielectric layer 204, wherein the first and second dielectric layers may comprise an ILD (FIG. 2a). The inductor structure 200 may further comprise a first layer of magnetic material 206, at least one adhesive layer 208, such as but not limited to a titanium containing material, a nitride layer 210, at least one conductive structure 212 that may comprise an inductive wire structure for example, and an opening 214 in at least one of the first and second dielectric layers 202, 204, that may comprise a magnetic via opening.

Figure 2B:
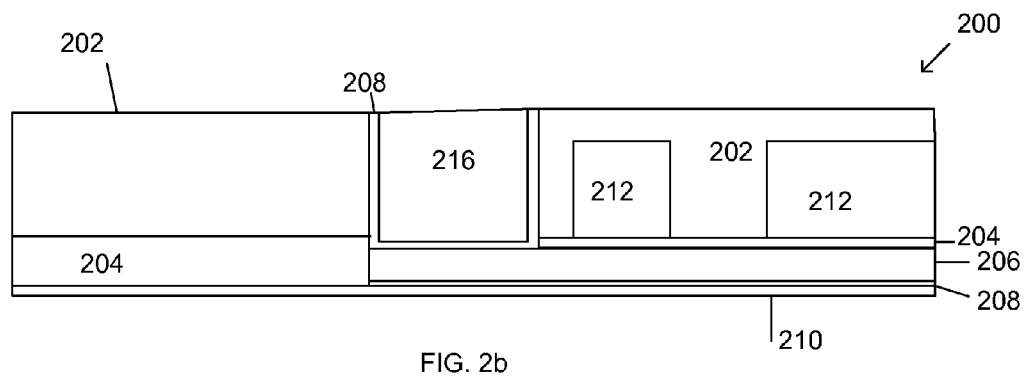

In one embodiment, the first layer of magnetic material 206 may comprise at least one of CoZrTa, CoNbTa, NiFe, CoP, CoPB, CoPRe, CoZr, CoZr Mo, FeCoAlN, CoZrTaN, FeCoP, CoPW, CoPBW, FeTaN, FeCoBSi. In another embodiment, the first layer of magnetic material 206 may comprise FeCoZrO, FeCoHfO, FeCoTiO, CoTi, FeCoB, soft ferrites such as CoZrOx and NiCuZnFeOx, and combinations thereof. These materials may have a variation in their composition in some cases. For example, CoZrTa can comprise a Zr percentage from about 3 to about 12 atomic percent, and can comprise a Ta percentage of about 3 to about 10 atomic percent. The magnetic via 214 may be filled with a via magnetic material 216, that may comprise a material different from the material of the first layer of magnetic material 206, but may be selected from the group of materials used to form the first layer of magnetic material 206, in one embodiment (FIG. 2b). In another embodiment, the via magnetic material 216 may comprise a material that is substantially the same as the material comprising the first layer of magnetic material 206.

The magnetic via 214 may be filled with the via magnetic material 216 and then polished back to form a planarized surface with the first dielectric layer 202, using a CMP process, for example, wherein a "plug" or filled via may be formed that may be independent of the first layer of magnetic material 206. The via magnetic material 216 may be a highly resistive and/or an insulative material that may be utilized to minimizing eddy currents within a device. In addition, the magnetic properties of the via magnetic material 216 may be optimized for high permeability in the vertical direction. Magnetic materials that can reduce eddy currents include the oxides such as FeCoZrO, FeCoHfO and soft ferrites such as CoZrOx and NiCuZnFeOx. Good permeability in the vertical direction can be achieved with a high aspect ratio via such that the height is greater than the diameter wherein a high permeability may be induced in the vertical direction. The process to form these oxides include using reactive sputtering and techniques such as annealing in an oxidizing atmosphere. In an embodiment, a magnetic field can be applied during deposition to induce magnetic anisotropy and good permeability in the vertical direction. In another embodiment, the magnetic via 214 may be filled with substantially the same magnetic material as the first layer of magnetic material 206.

Figure 2C:
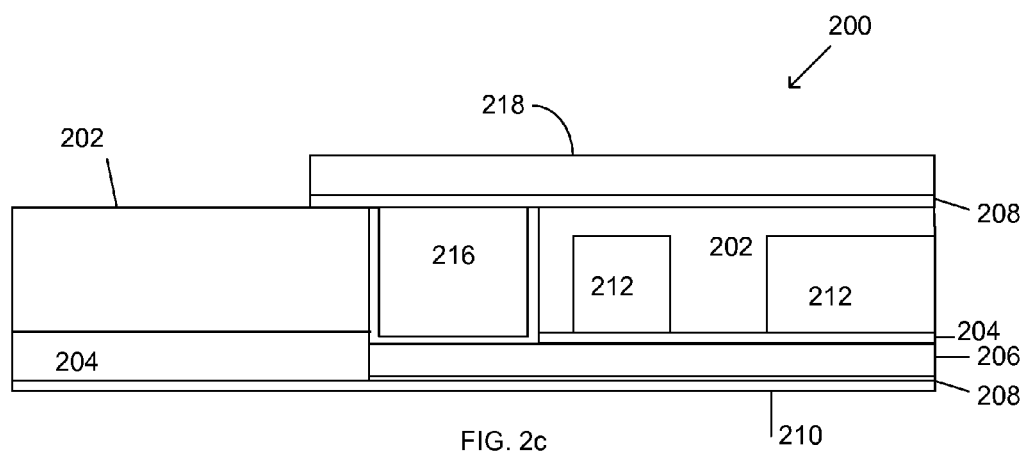

In one embodiment, a layer of the adhesion material 208 may be formed on the via magnetic material 216 and then a second layer of magnetic material 218 may be formed on the adhesion material 208 (FIG. 2c). The second layer of magnetic material 218 may comprise materials similar to the first layer of magnetic material 206, in an embodiment, and may comprise materials that are different from the materials comprising the via magnetic materials 216.

Benefits of the present invention include providing methods, such as damascene processing methods, of fabricating inductive devices utilizing magnetic materials in integrated circuits. Inductive devices such as inductors and transformers may be fabricating according to the embodiments of the present invention. Another component of the invention is to effectively incorporate the magnetic material within a dielectric, such as the ILD layers of FIG. 1k, for example. This can be done because the magnetic material does not have to be electrically connected to the circuitry located on the device, or it may be grounded only. It would not typically be used as part of an electrical circuit because of the high resistivity of the magnetic material.

In addition, contrary to conventional interconnections where inter-level capacitance is undesirable and needs to be minimized, the dielectric surrounding the magnetic material does not need to be thick because capacitance does not need to be minimized with many circuits such as power converters. In fact, added capacitance can actually be beneficial. Furthermore, circuits such as operational voltage converter circuits may be fabricated using on-chip and/or on package transformers, capacitors, and inductors with magnetic materials according to embodiments of the present invention, and such circuits may be utilized in server and mobile applications, for example. Fully-integrated voltage converters including those used in multicore processors that need micro-level management of power may benefit from the use of structures according to embodiments of the present invention.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices, such as inductive structures, are well known in the art. Therefore, it is appreciated that the Figures provided herein illustrate only portions of an exemplary microelectronic device that pertains to the practice of the present invention. Thus the present invention is not limited to the structures described herein.

What is claimed is:
1. A structure comprising:
   a first layer of magnetic material disposed in a first dielectric layer;
   at least one first via is disposed in the first dielectric layer;

a barrier layer disposed in the at least one first via that is disposed in the first dielectric layer;

a conductive material disposed on the barrier layer in the first dielectric layer;

a second dielectric layer disposed on the first magnetic layer;

at least one second via and at least one conductive structure disposed in the second dielectric layer, the at least one second via and the at least one conductive structure comprising a barrier layer;

a conductive material disposed in the at least one second via and in the at least one conductive structure in the second dielectric layer;

a third layer of dielectric material disposed on the conductive structure and at least one second via in the second dielectric layer; and a second layer of magnetic material disposed within a portions of the second and the third layer of dielectric material, wherein the first and second layers of the magnetic material are coupled to one another.

2. The structure of claim 1 wherein the magnetic material comprises CoZrTa, CoNbTa, NiFe, CoP, CoPB, CoPRe, CoZr, CoZr Mo, FeCoAlN, CoZrTaN, FeCoP, CoPW, CoPBW, FeTaN, FeCoBSi, FeCoZrO, FeCoHfO, FeCoTiO, CoTi, FeCoB, CoZrOx, NiCuZnFeOx and combinations thereof.

3. The structure of claim 1 further comprising a conductive bump coupled to the at least one via, wherein the conductive bump is disposed on a passivation layer disposed on the second layer of magnetic material.

4. The structure of claim 1 wherein at least one of the first, second and third dielectric layers comprises an ILD, wherein the ILD comprises a thickness of less than about 3.5 microns.

5. The structure of claim 1 wherein a distance between a top surface of the conductive structure disposed in the second dielectric layer and a bottom surface of the second layer of magnetic material comprises below about 0.5 micron.

6. The structure of claim 1 wherein a seed layer is disposed beneath the first and second layers of magnetic material.

7. The structure of claim 1 wherein the structure comprises a portion of a package substrate comprising a multilevel metallization CMOS structure.

8. The structure of claim 1 wherein the structure comprises a portion of at least one of an on-chip and an on-package voltage converter, an RF high-frequency circuit, an EMI noise reduction circuit and radar circuitry.

* * * * *